United States Patent
Yokota

(10) Patent No.: US 10,908,443 B2
(45) Date of Patent: Feb. 2, 2021

(54) DISPLAY DEVICE

(71) Applicants: Panasonic Liquid Crystal Display Co., Ltd., Hyogo (JP); Pasona Knowledge Partner Inc., Osaka (JP)

(72) Inventor: Shuhei Yokota, Hyogo (JP)

(73) Assignees: PANASONIC LIQUID CRYSTAL DISPLAY CO., LTD., Hyogo (JP); PASONA KNOWLEDGE PARTNER INC., Osaka (JP)

( * ) Notice: Subject to any disclaimer, the term of this patent is extended or adjusted under 35 U.S.C. 154(b) by 0 days.

(21) Appl. No.: 16/017,548

(22) Filed: Jun. 25, 2018

(65) Prior Publication Data

US 2019/0004363 A1    Jan. 3, 2019

(30) Foreign Application Priority Data

Jun. 29, 2017 (JP) ................. 2017-127272

(51) Int. Cl.
*G02F 1/1333* (2006.01)
*G02F 1/1339* (2006.01)
(Continued)

(52) U.S. Cl.
CPC ..... *G02F 1/133308* (2013.01); *G02B 6/0088* (2013.01); *G02F 1/1339* (2013.01);
(Continued)

(58) Field of Classification Search
CPC .............................. G02F 1/133308
See application file for complete search history.

(56) References Cited

U.S. PATENT DOCUMENTS

2002/0080298 A1* 6/2002 Fukayama .......... G02F 1/13452
349/58
2005/0062902 A1 3/2005 Fukayama
(Continued)

FOREIGN PATENT DOCUMENTS

JP      2002-196312      7/2002
JP      2005-129346      5/2005
(Continued)

OTHER PUBLICATIONS

English translation for Okizaki (JP 2007/024913), published in 2007.*

*Primary Examiner* — Edmond C Lau
*Assistant Examiner* — Jonathan Y Jung
(74) *Attorney, Agent, or Firm* — Hamre, Schumann, Mueller & Larson, P.C.

(57) ABSTRACT

A display device includes: a first frame including a frame portion covering a peripheral portion of a display panel; a second frame including a panel support sandwiching the display panel with the frame portion; an optical sheet being opposite to the display panel in a first direction, an outer peripheral end of the optical sheet being opposite to the panel support; a transparent substrate on which the optical sheet is disposed; a third frame including a main body having an accommodation space accommodating light emitting elements, and a substrate support extending from the main body to support the transparent substrate; and spacer members disposed between the panel support and the substrate support. The optical sheet and the panel support are disposed with a space interposed therebetween in the first direction, and each spacer member includes a restriction unit restricting movement of the transparent substrate in the first direction.

12 Claims, 13 Drawing Sheets

(51) Int. Cl.
  *G02F 1/1335* (2006.01)
  *G02F 1/13357* (2006.01)
  *G02F 1/1368* (2006.01)
  *G02F 1/1345* (2006.01)
  *H01L 27/12* (2006.01)
  *G09G 3/36* (2006.01)
  *F21V 8/00* (2006.01)
  *G02F 1/1347* (2006.01)

(52) U.S. Cl.
  CPC ........ *G02F 1/1368* (2013.01); *G02F 1/13452* (2013.01); *G02F 1/13471* (2013.01); *G02F 1/133512* (2013.01); *G02F 1/133514* (2013.01); *G02F 1/133528* (2013.01); *G02F 1/133603* (2013.01); *G09G 3/3655* (2013.01); *H01L 27/1214* (2013.01); *G02F 2001/133317* (2013.01); *G02F 2001/133322* (2013.01)

(56) References Cited

U.S. PATENT DOCUMENTS

| | | | |
|---|---|---|---|
| 2005/0099604 A1* | 5/2005 | Mizumaki | G02B 6/0086 353/27 R |
| 2005/0151894 A1* | 7/2005 | Katsuda | G02F 1/133308 349/58 |
| 2005/0185394 A1* | 8/2005 | Sakamoto | G02B 6/0083 362/133 |
| 2006/0044779 A1 | 3/2006 | Lee | |
| 2007/0242183 A1 | 10/2007 | Fukayama | |
| 2009/0046212 A1 | 2/2009 | Tsubata et al. | |
| 2009/0046217 A1 | 2/2009 | Fukayama | |
| 2009/0273743 A1 | 11/2009 | Sawabe et al. | |
| 2009/0322984 A1 | 12/2009 | Lee | |
| 2010/0033655 A1* | 2/2010 | Nakamoto | H04N 5/66 349/81 |
| 2012/0033157 A1* | 2/2012 | Sasaki | G02F 1/133608 349/64 |
| 2013/0039021 A1* | 2/2013 | Liu | H05K 9/0096 361/748 |
| 2015/0177527 A1* | 6/2015 | Park | G02B 30/52 359/462 |
| 2016/0223867 A1* | 8/2016 | Kim | G02F 1/133608 |
| 2017/0205569 A1* | 7/2017 | Sugimoto | G02B 6/0088 |

FOREIGN PATENT DOCUMENTS

| | | |
|---|---|---|
| JP | 2006-66359 | 3/2006 |
| JP | 2007024913 A * | 2/2007 |
| JP | 2011-123297 | 6/2011 |
| JP | 2017-102148 | 6/2017 |
| WO | 2007/040158 | 4/2007 |
| WO | 2007/086166 | 8/2007 |

* cited by examiner

DISPLAY DEVICE

CROSS-REFERENCE TO RELATED APPLICATION

This application claims priority from Japanese application JP 2017-127272, filed Jun. 29, 2017. This Japanese application is incorporated herein by reference.

TECHNICAL FIELD

The present invention relates to a display device.

BACKGROUND

Since the liquid crystal display device can display an image with low power consumption, the liquid crystal display device is used as a display for a television, a monitor, or the like. However, the liquid crystal display device has a contrast ratio lower than an organic EL (Electro Luminescence) display device.

A technique, in which two display panels are superimposed each other and an image is displayed on each display panel based on an input video signal, is conventionally proposed to improve the contrast ratio of the liquid crystal display device. For example, WO 2007/040158 discloses a liquid crystal display device capable of improving the contrast ratio by superimposing a first liquid crystal display panel displaying a color image and a second liquid crystal display panel displaying a monochrome image on each other.

SUMMARY

In recent years, a direct-under type LED backlight constructed with a plurality of LEDs two-dimensionally arrayed is used in a liquid crystal display device. An optical sheet is disposed in front of the plurality of LEDs.

In such liquid crystal display devices, undulation is generated in an optical sheet disposed in front of the plurality of LEDs, which results in degradation of image quality. In particular, in the liquid crystal display device in which two liquid crystal display panels superimposed on each other, a light amount of the backlight is set larger in order to compensate for a decrease in light transmittance by each liquid crystal display panel. For this reason, the undulation of the optical sheet is conspicuous.

The present disclosure provide a display device that can prevent the undulation generated in the optical sheet.

To solve the above problem, a display device according to a present disclosure comprises: a display panel; a first frame including a frame portion covering a peripheral portion of a display surface of the display panel; a second frame including a panel support sandwiching the display panel with the frame portion; an optical sheet that is opposite to the display panel in a first direction, an outer peripheral end of the optical sheet being opposite to the panel support; a transparent substrate on which the optical sheet is disposed; a third frame including a main body having an accommodation space in which a plurality of light emitting elements are accommodated, and a substrate support extending from the main body to support the transparent substrate; and a plurality of spacer members disposed between the panel support and the substrate support. The optical sheet and the panel support are disposed with a space interposed therebetween in the first direction, and each of the plurality of spacer members includes a restriction unit that restricts movement of the transparent substrate in the first direction.

DETAILED DESCRIPTION

The following describes an exemplary embodiment of the present disclosure. The embodiment described below is merely one specific example of the present disclosure. The numerical values, shapes, materials, elements, and arrangement and connection of the elements, etc. indicated in the following embodiment are given merely by way of illustration and are not intended to limit the present disclosure. Therefore, among elements in the following embodiment, those not recited in any one of the independent claims defining the broadest inventive concept of the present disclosure are described as optional elements.

Note that the figures are schematic illustrations and are not necessarily precise depictions. Accordingly, the figures are not necessarily to scale. Moreover, in the figures, elements that are essentially the same share like reference signs. Accordingly, duplicate description is omitted or simplified.

Figure 1:
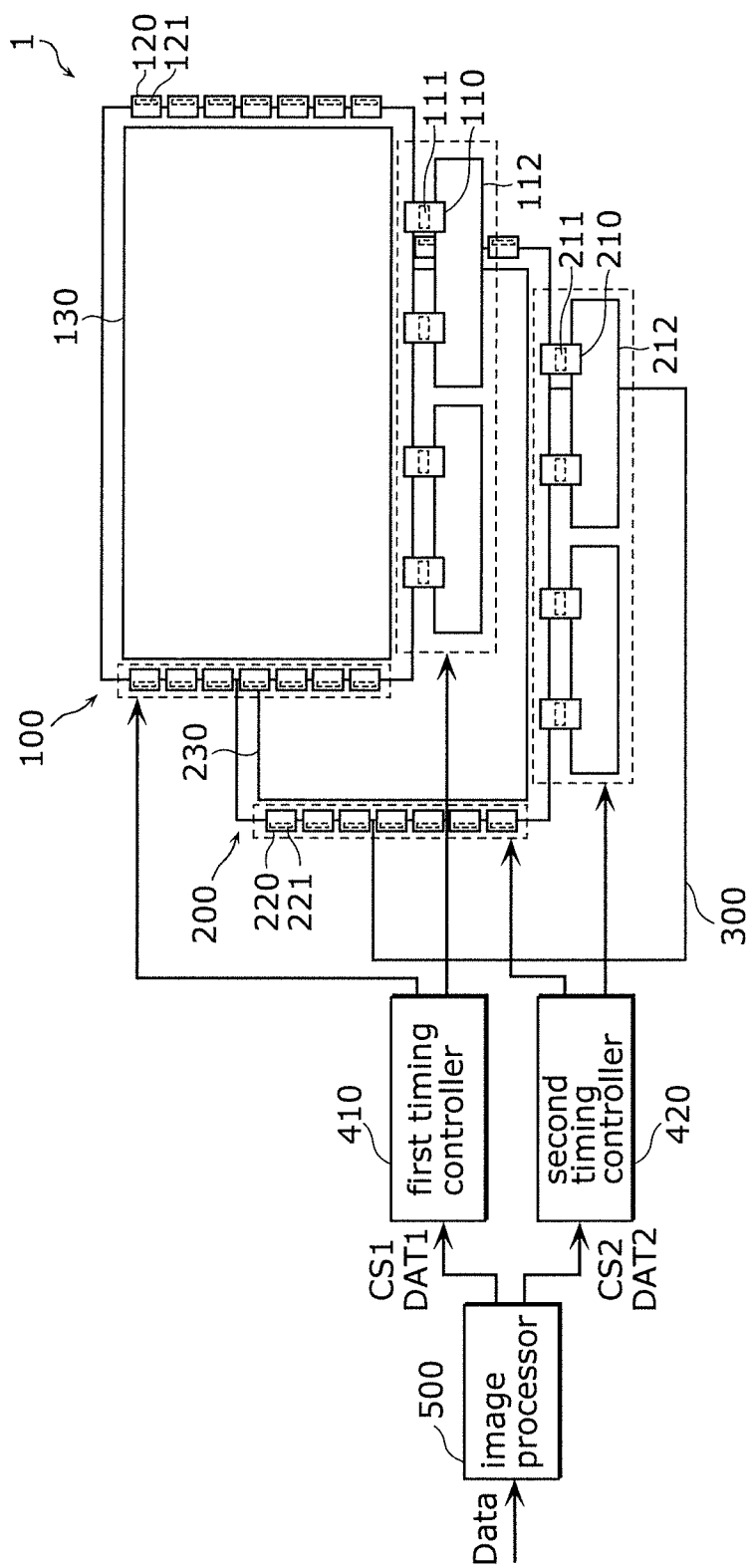
FIG. 1 is a view illustrating a schematic configuration of a display device according to an exemplary embodiment.
Figure 2:
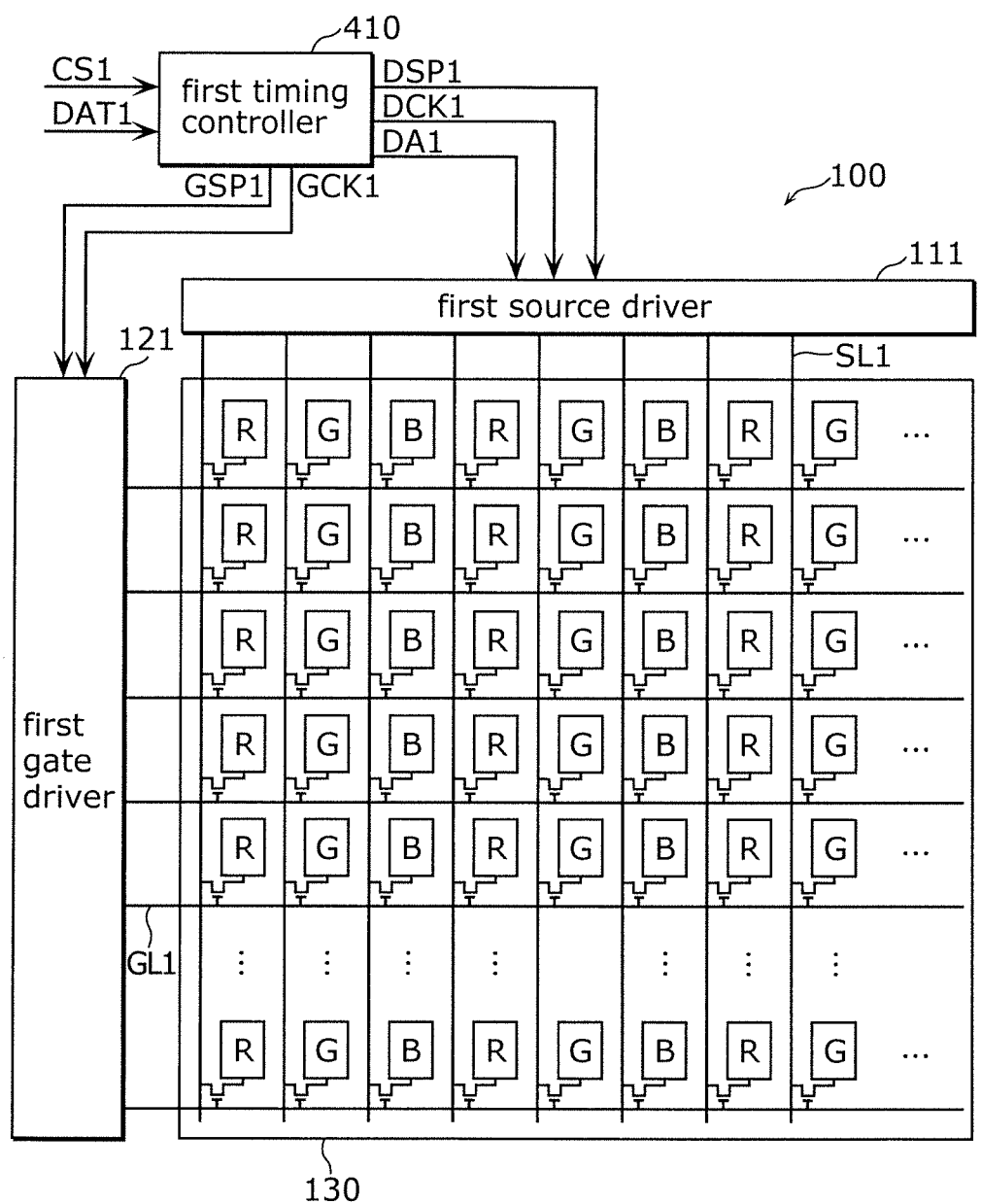
FIG. 2 is a view illustrating the schematic configuration of a first display panel of the display device according to the exemplary embodiment.
Figure 3:
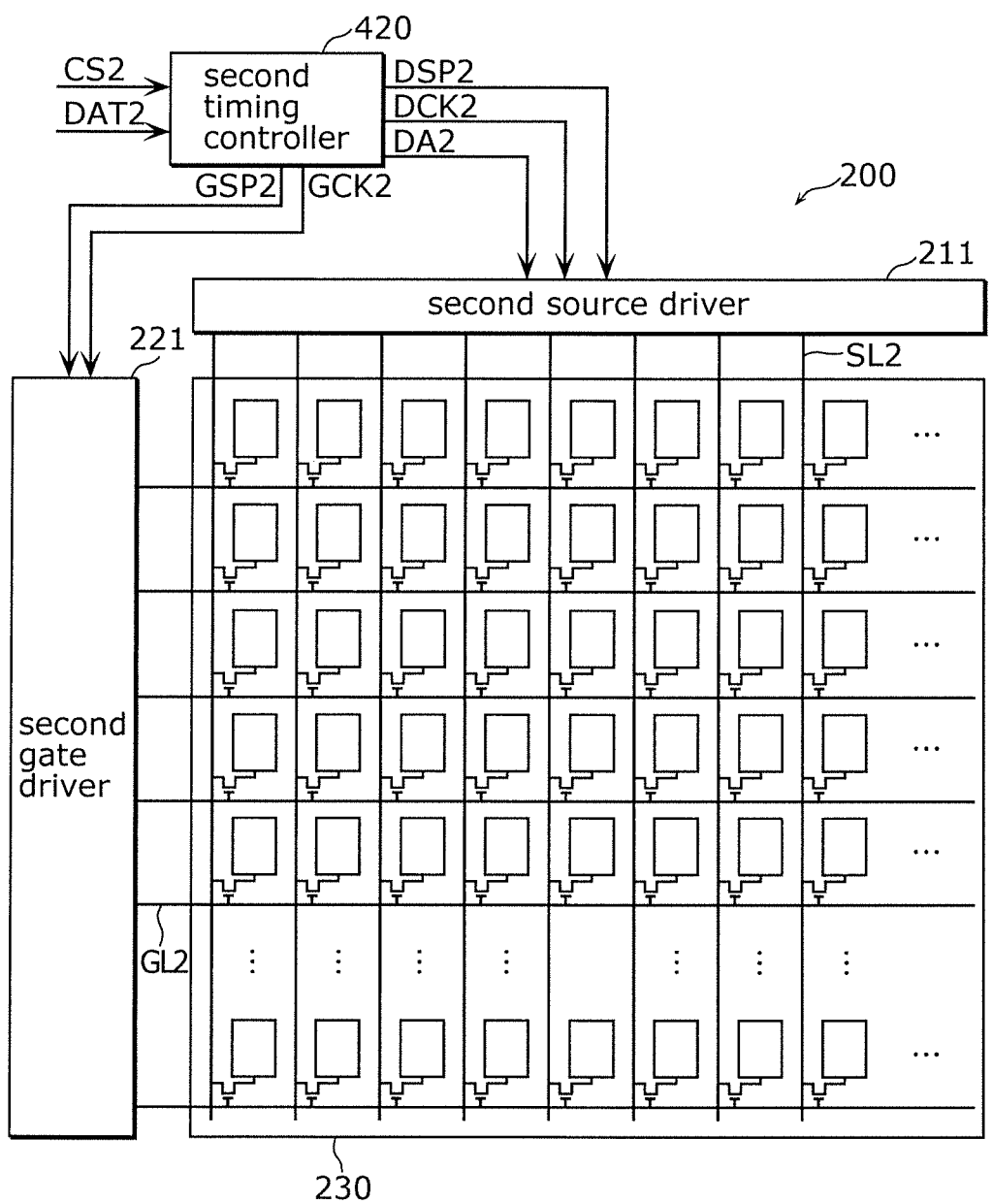
FIG. 3 is a view illustrating the schematic configuration of a second display panel of the display device according to the exemplary embodiment.

FIG. 1 is a view illustrating a schematic configuration of a display device according to an exemplary embodiment. FIG. 2 is a view illustrating the schematic configuration of a first display panel of the display device according to the exemplary embodiment. FIG. 3 is a view illustrating the schematic configuration of a second display panel of the display device according to the exemplary embodiment.

Display device 1 is an image display device that displays an image (video) of a still image or a moving image. As illustrated in FIG. 1, display device 1 includes first display panel 100 disposed at a position (front side) close to a viewer and second display panel 200 disposed at a position (rear side) farther from the viewer than first display panel 100. First display panel 100 and second display panel 200 have an identical outer shape in planar view, but first display panel 100 and second display panel 200 are not limited to the identical outer shape.

In the present exemplary embodiment, display device 1 is a liquid crystal display device in which first display panel 100 and second display panel 200 are constructed with the liquid crystal display panel.

First display panel 100 is a main panel that displays an image visually recognized by a user. For example, first display panel 100 displays a color image as the image visually recognized by the user.

First source FPC (Flexible Print Circuit) 110 and first gate FPC 120 are connected to first display panel 100. First source FPC 110 and first gate FPC 120 are connected to electrode terminals of various signal lines of first display panel 100 by thermocompression bonding using, for example, an Anisotropic Conductive Film (ACF).

First source driver 111 is mounted on first source FPC 110, and first gate driver 121 is mounted on first gate FPC 120. First circuit board 112 is connected to first source FPC 110. First circuit board 112 is a Printed Circuit Board (PCB) on which a plurality of electronic components are mounted, and has a function of transmitting various signals output from first timing controller 410 to first source driver 111 of first source FPC 110.

When the color image is displayed in first image display region 130 of first display panel 100, various signals output from first timing controller 410 are input to first source driver 111 and first gate driver 121. The various signals are input to first source driver 111 through first circuit board 112.

Second display panel 200 is a sub-panel disposed on a back side of first display panel 100. For example, second display panel 200 displays a monochrome image (black-and-white image) of an image pattern corresponding to the color image displayed on first display panel 100 in synchronization with the color image.

Second source FPC 210 and second gate FPC 220 are connected to second display panel 200. Second source FPC 210 and second gate FPC 220 are connected to electrode terminals of various signal lines of the second display panel 200 by thermocompression bonding using, for example, the ACF.

Second source driver 211 is mounted on second source FPC 210, and second gate driver 221 is mounted on second gate FPC 220. Second circuit board 212 is connected to second source FPC 210. The second circuit board 212 is a substantially rectangular plate-shaped PCB on which a plurality of electronic components are mounted, and has a function of transmitting various signals output from second timing controller 420 to second source driver 211 of second source FPC 210.

When the monochrome image is displayed in second image display region 230 of second display panel 200, various signals output from second timing controller 420 are input to second source driver 211 and second gate driver 221. Various signals are input to second source driver 211 through second circuit board 212.

As illustrated in FIGS. 2 and 3, first image display region 130 and second image display region 230 are constructed with a plurality of pixels partitioned in a matrix shape. A number of pixels in first image display region 130 and a number of pixels in second image display region 230 may be identical to or different from each other, but the number of pixels in first image display region 130 in first display panel 100 is preferably larger than the number of pixels of second image display region 230 in second display panel 200 which is of a sub-panel.

In the present exemplary embodiment, display device 1 is a liquid crystal display device, and both first display panel 100 and second display panel 200 are a liquid crystal display panel. For example, liquid crystal driving systems of first display panel 100 and second display panel 200 are a lateral electric field system such as an In Plane Switching (IPS) system or a Fringe Field Switching (FFS) system. However, the liquid crystal driving systems of first display panel 100 and second display panel 200 are not limited to the lateral electric field system. The liquid crystal driving systems of first display panel 100 and second display panel 200 may be a Vertical Alignment (VA) system, a Twisted Nematic (TN) system, or the like.

Display device 1 also includes backlight 300. Backlight 300 is disposed on the rear side of second display panel 200.

Backlight 300 emits light toward first display panel 100 and second display panel 200. For example, backlight 300 is a light emitting diode (LED) backlight in which an LED is used as a light source. However, the light source of backlight 300 is not limited to the LED.

Display device 1 also includes first timing controller 410 that controls first source driver 111 and first gate driver 121 of first display panel 100, second timing controller 420 that controls second source driver 211 and second gate driver 221 of second display panel 200, and image processor 500 that outputs image data to first timing controller 410 and second timing controller 420.

As illustrated in FIG. 2, based on first image data DAT1 and first control signal CS1 (such as a clock signal, a vertical synchronizing signal, and a horizontal synchronizing signal), which are output from image processor 500, first timing controller 410 generates first image data signal DA1 and various timing signals (data start pulse DSP1, data clock DCK1, gate start pulse GSP1, and gate clock GCK1) used to control drive of first source driver 111 and first gate driver 121. First timing controller 410 outputs first image data signal DA1, data start pulse DSP1, and data clock DCK1 to first source driver 111, and outputs gate start pulse GSP1 and gate clock GCK1 to first gate driver 121.

First source driver 111 outputs a data voltage (data signal) corresponding to first image data signal DA1 to source wiring SL1 of first display panel 100, based on data start pulse DSP1 and data clock DCK1. First gate driver 121 outputs a gate voltage (gate signal) to gate wiring GL1 of first display panel 100 based on gate start pulse GSP1 and gate clock GCK1. Consequently, the color image is displayed in first image display region 130.

As illustrated in FIG. 3, based on second image data DAT2 and second control signal CS2 (a clock signal, a vertical synchronizing signal, and a horizontal synchronizing signal), which are output from image processor 500, second timing controller 420 generates second image data DA2 and various timing signals (data start pulse DSP2, data clock DCK2, gate start pulse GSP2, and gate clock GCK2) to drive of second source driver 211 and second gate driver 221. Second timing controller 420 outputs second image data signal DA2, data start pulse DSP2, and data clock DCK2 to second source driver 211, and outputs gate start pulse GSP2 and gate clock GCK2 to second gate driver 221.

Second source driver 211 outputs a data voltage (data signal) corresponding to second image data signal DA2 to source wiring SL2 of second display panel 200 based on data start pulse DSP2 and data clock DCK2. Second gate driver 221 outputs a gate voltage (gate signal) to gate wiring GL2 of second display panel 200, based on gate start pulse GSP2 and gate clock GCK2. Consequently, the monochrome image is displayed in second image display region 230.

As illustrated in FIG. 1, image processor 500 receives input video signal Data transmitted from an external system (not illustrated), performs predetermined image processing on input video signal Data, outputs first image data DAT1 to first timing controller 410, and outputs second image data DAT2 to second timing controller 420. First image data DAT1 is image data used to display the color image, and second image data DAT2 is image data used to display the monochrome image.

Image processor 500 outputs first control signal CS1 to first timing controller 410, and outputs second control signal CS2 to second timing controller 420. First control signal CS1 and second control signal CS2 include synchronizing signals synchronizing the color image displayed on first display panel 100 and the monochrome image displayed on second display panel 200.

In liquid crystal display device 1 of the exemplary embodiment, the image is displayed while two display panels of first display panel 100 and second display panel 200 are superimposed on each other, so that black of the display image can be tightened. Consequently, the image having a high contrast ratio can be displayed. For example, display device 1 is a high dynamic range (HDR) compatible television, and a local dimming compatible direct-under type LED backlight may be used as backlight 300. In this case, the color image having the higher contrast ratio and higher image quality can be displayed.

When local dimming is performed by backlight 300, a backlight driving circuit (not illustrated) selectively causes a plurality of LEDs of backlight 300 to emit light at timing and luminance corresponding to an emission control signal input from image processing unit 500.

Figure 4:
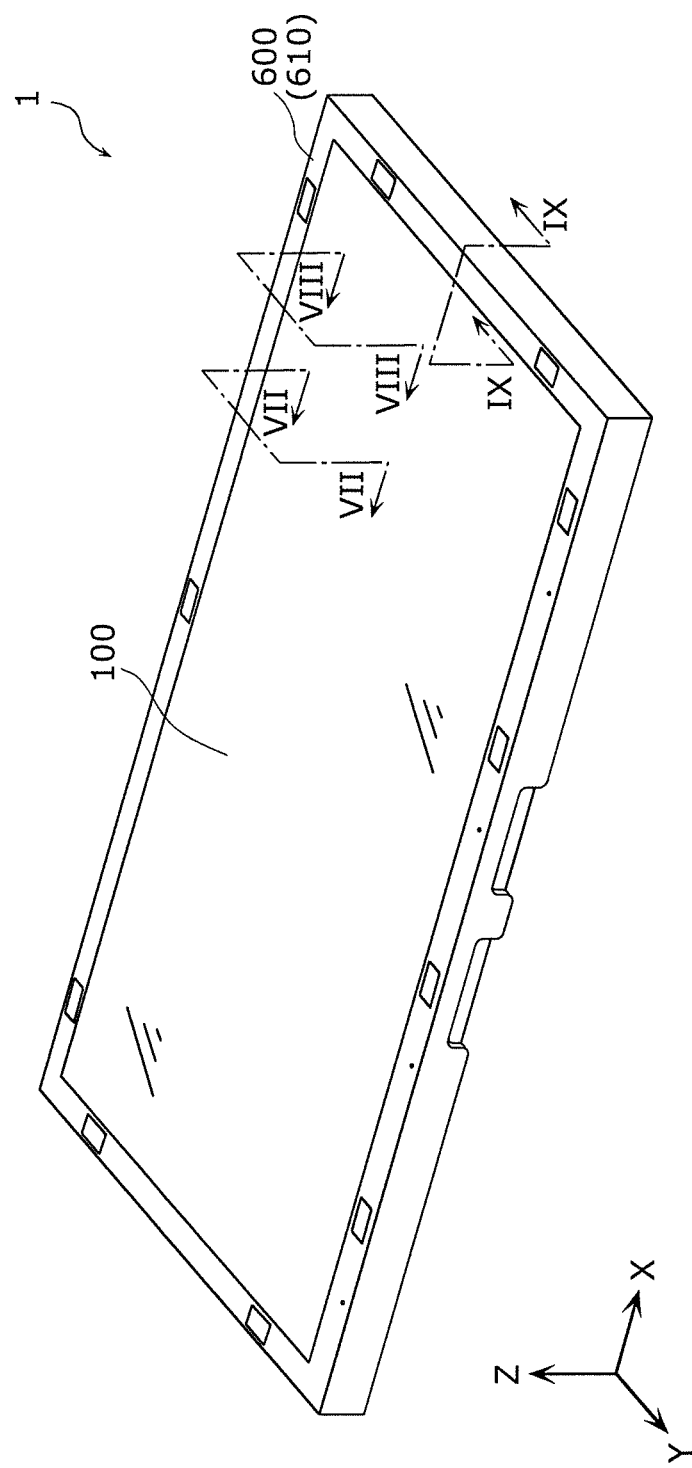
FIG. 4 is a perspective view of the display device according to the exemplary embodiment.
Figure 5:
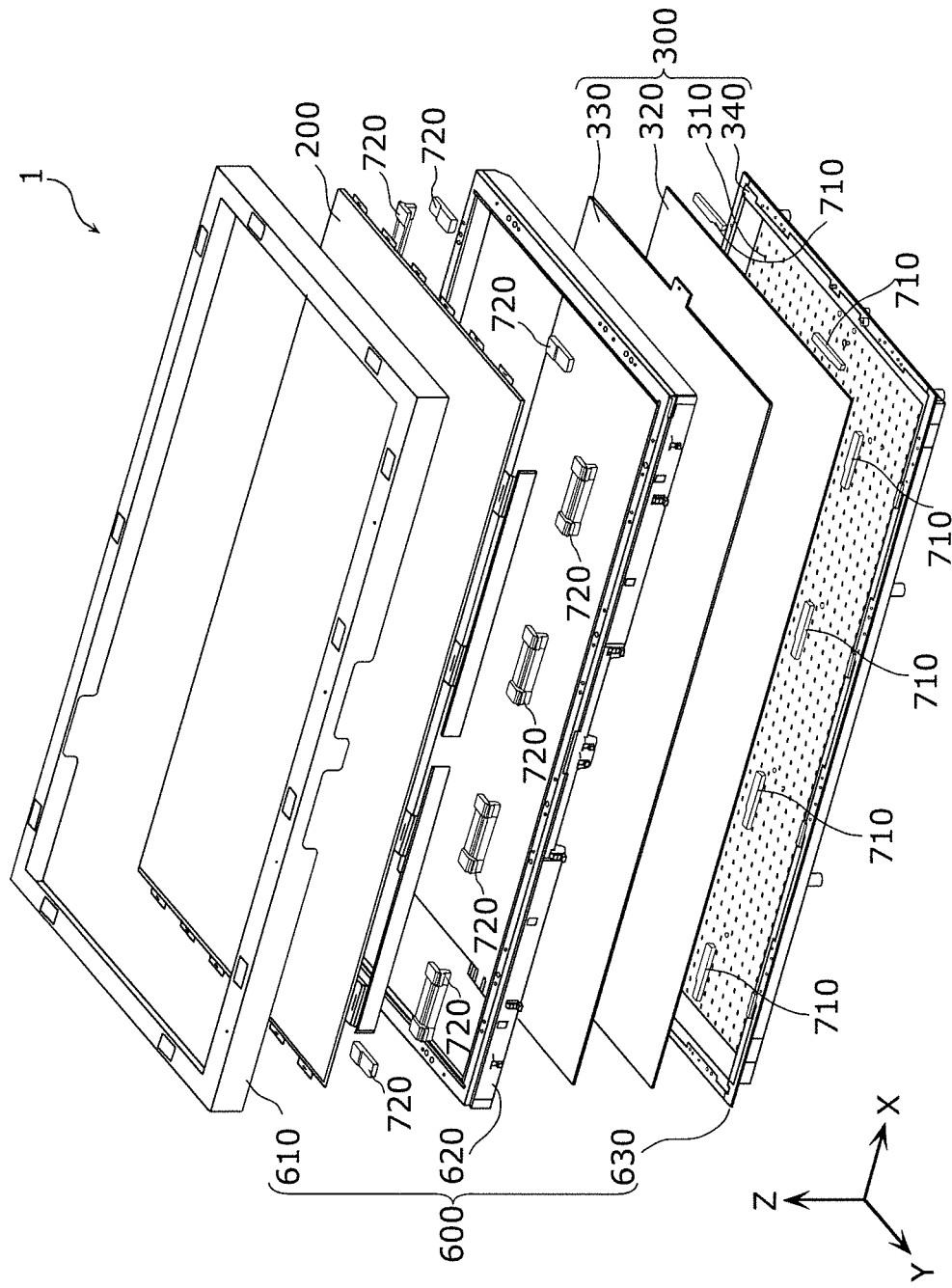
FIG. 5 is an exploded perspective view of the display device according to the exemplary embodiment.
Figure 6:
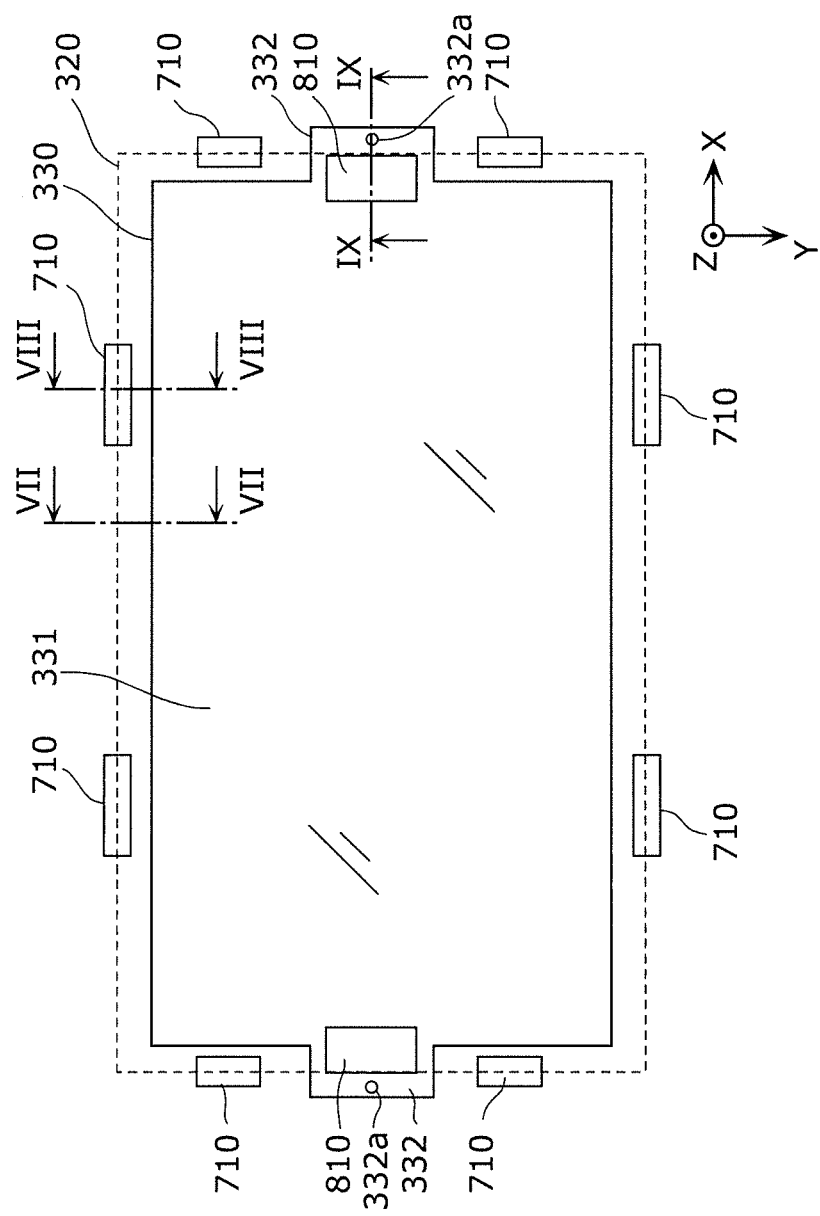
FIG. 6 is a view illustrating a planar layout of a transparent substrate, an optical sheet and a first spacer member in the display device according to the exemplary embodiment.
Figure 7:
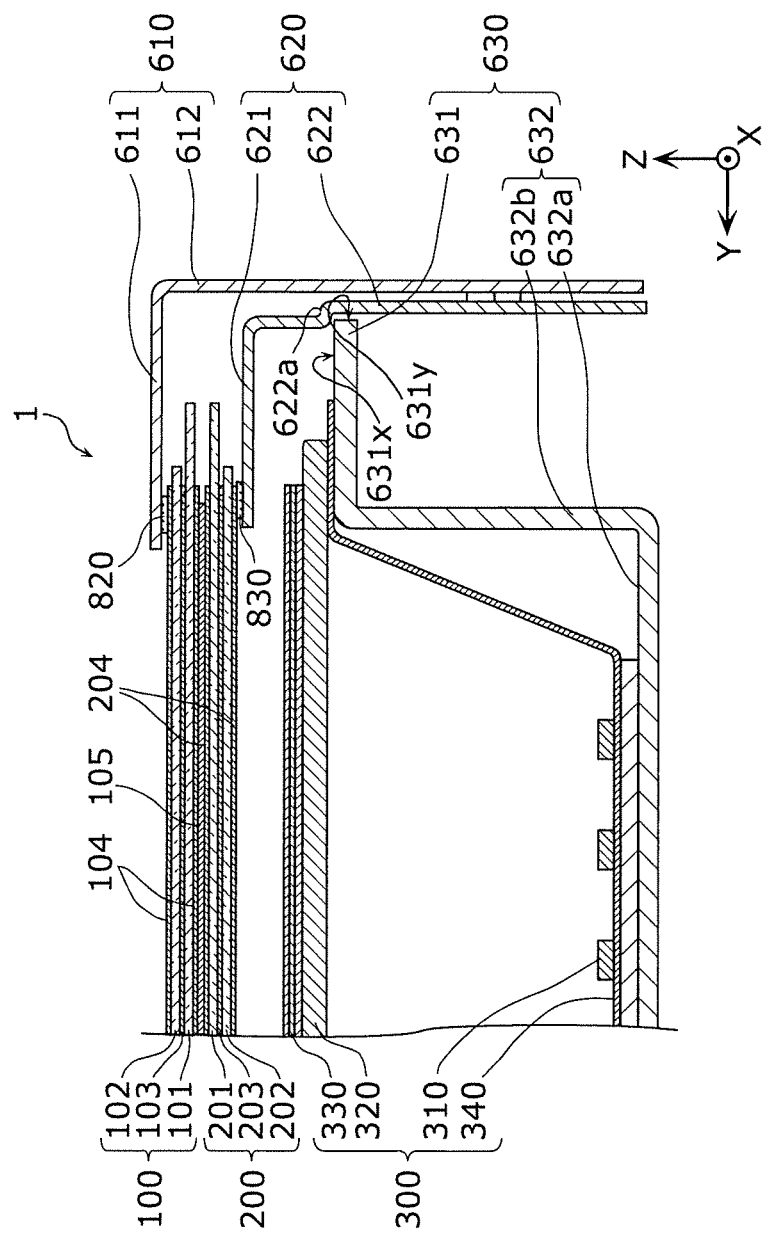
FIG. 7 is a cross-sectional view of the display device according to the exemplary embodiment taken along lines VII-VII in FIGS. 4 and 6.
Figure 8:
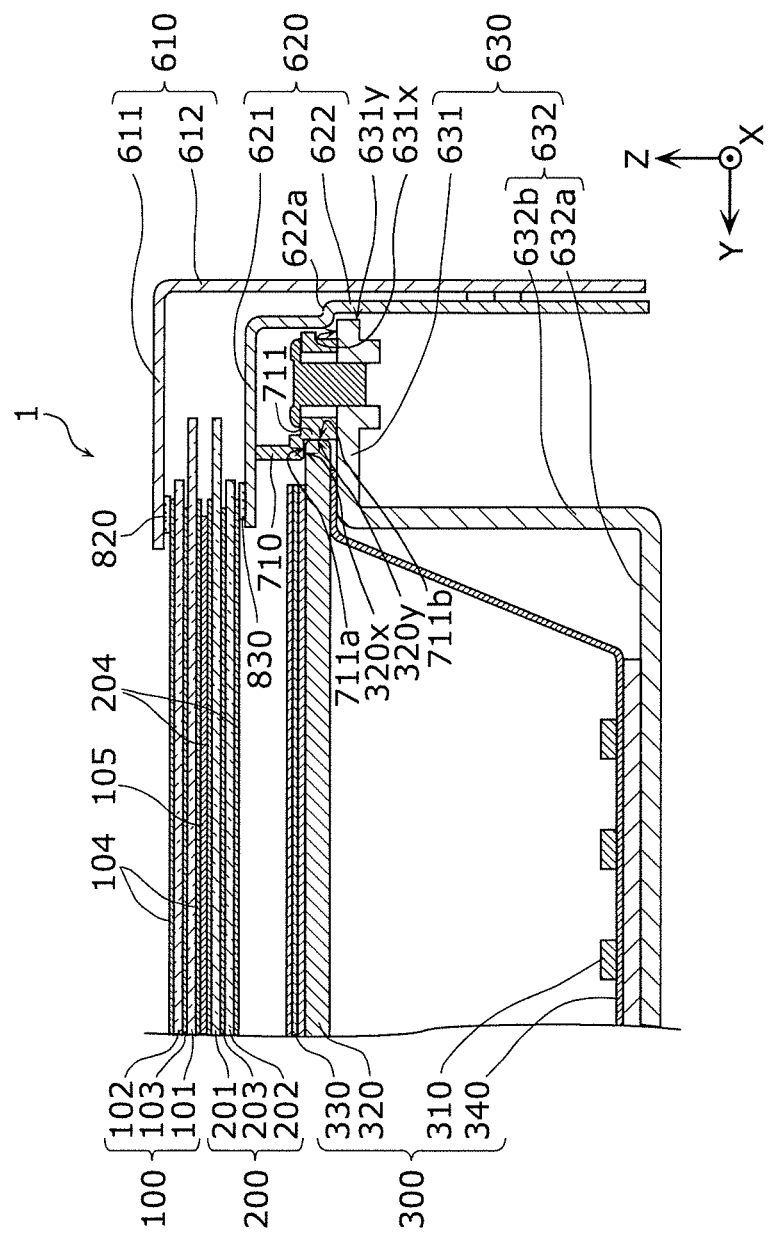
FIG. 8 is a cross-sectional view of the display device according to the exemplary embodiment taken along lines VIII-VIII in FIGS. 4 and 6.
Figure 9:
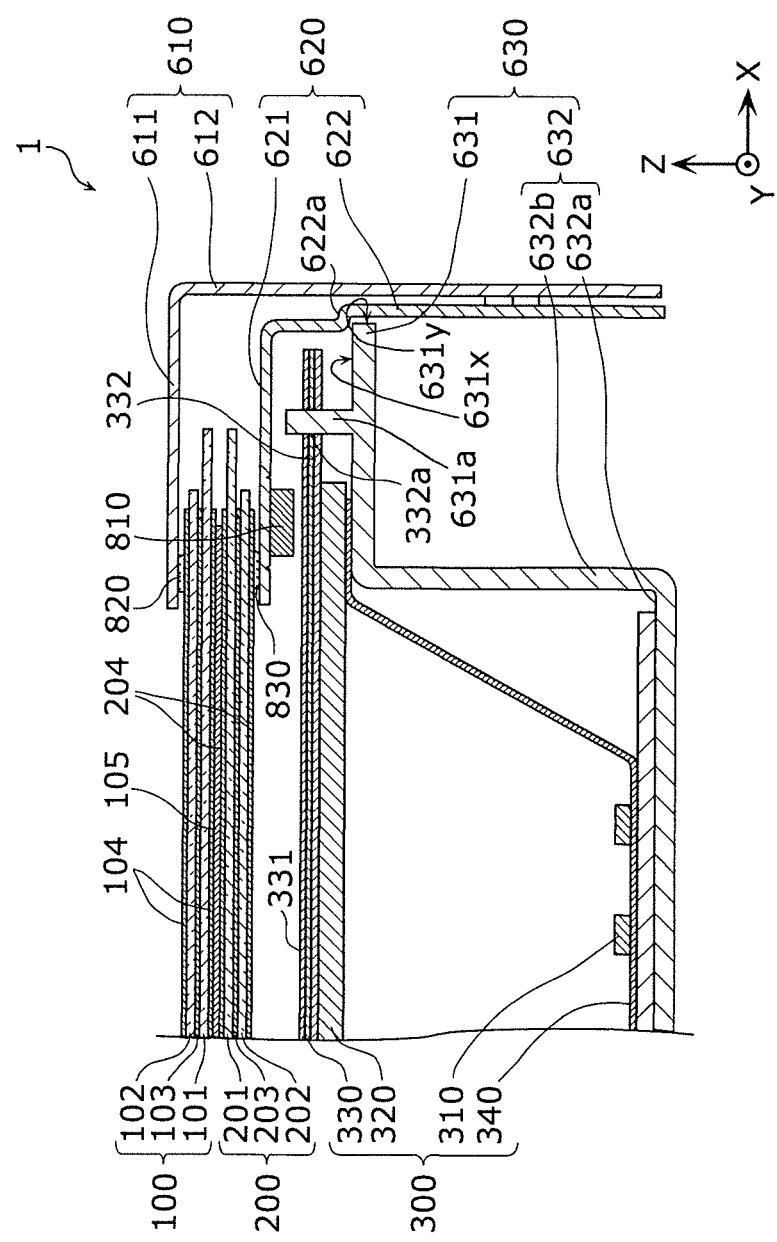
FIG. 9 is a cross-sectional view of the display device according to the exemplary embodiment taken along lines IX-IX in FIGS. 4 and 6.

Structural features of display device 1 of the exemplary embodiment will be described below with reference to FIGS. 4 to 9. FIG. 4 is a perspective view of display device 1 of the exemplary embodiment. FIG. 5 is an exploded perspective view of display device 1. FIG. 6 is a view illustrating a planar layout of transparent substrate 320, optical sheet 330, and first spacer member 710 in display device 1. FIGS. 7, 8, and 9 are cross-sectional views of display device 1 taken along lines VII-VII, VIII-VIII, and IX-IX in FIGS. 4 and 6, respectively.

In FIG. 5, for convenience, first display panel 100 is omitted, and a screw screwing each member is also omitted.

As illustrated in FIGS. 4 to 9, display device 1 includes first display panel 100, second display panel 200, backlight 300, frame 600, first spacer member 710, and second spacer member 720.

Frame 600 is a holding member that holds first display panel 100, second display panel 200, and backlight 300. In the present exemplary embodiment, frame 600 includes upper frame 610 (first frame), middle frame 620 (second frame), and lower frame 630 (third frame).

In display device 1, upper frame 610, first display panel 100, second display panel 200, middle frame 620, and lower frame 630 are disposed in this order from a viewer side.

A plurality of first spacer members 710 are disposed between middle frame 620 and lower frame 630. A plurality of second spacer members 720 are disposed between middle frame 620 and upper frame 610. First spacer member 710 and second spacer member 720 are a resin molded article made of, for example, a resin material. However, first spacer member 710 and second spacer member 720 are not limited to the resin molded article, and may be made of a metal material or the like.

As illustrated in FIGS. 7 to 9, first display panel 100 and second display panel 200 overlap each other. Specifically, first display panel 100 is disposed on an outside (on the viewer side), and second display panel 200 is disposed on an inside.

First display panel 100 is a liquid crystal cell (open cell) including first Thin Film Transistor (TFT) substrate 101, first counter substrate 102 opposed to first TFT substrate 101, and first liquid crystal layer 103 disposed between first TFT substrate 101 and first counter substrate 102. In the present exemplary embodiment, First counter substrate 102 out of first TFT substrate 101 and first counter substrate 102 is located on the viewer side.

First TFT substrate 101 is a substrate in which a TFT layer is formed on a transparent substrate such as a glass substrate. The TFT layer is a driving circuit layer, and a TFT, a wiring for driving the TFT, and the like are formed in the TFT layer. A pixel electrode used to apply voltage to first liquid crystal layer 103 is formed on a planarization layer of the TFT layer.

First counter substrate 102 is a CF substrate in which a color filter layer as a pixel formation layer is formed on a transparent substrate such as a glass substrate. The pixel formation layer of first counter substrate 102 includes a black matrix (black portion) and a color filter (colored portion). The black matrix is formed into, for example, a lattice shape or a stripe shape, and a plurality of matrix-shaped openings constituting pixels are formed in the black matrix. A color filter is formed in each opening of the black matrix. For example, each color filter is a red color filter, a green color filter, or a blue color filter. The color filter of each color corresponds to each pixel.

First liquid crystal layer 103 is sealed in a gap between first TFT substrate 101 and first counter substrate 102. The liquid crystal material of first liquid crystal layer 103 can be appropriately selected according to the driving system.

Second display panel 200 is a liquid crystal cell (open cell) including second TFT substrate 201, second counter substrate 202 opposed to second TFT substrate 201, and second liquid crystal layer 203 disposed between second TFT substrate 201 and second counter substrate 202. In the present exemplary embodiment, second TFT substrate 201 out of second TFT substrate 201 and second counter substrate 202 is located on the viewer side.

That is, second display panel 200 is disposed while the TFT substrate and the counter substrate (CF substrate) are reversed with respect to first display panel 100. Specifically, first display panel 100 and second display panel 200 are disposed such that the TFT substrates (first TFT substrate 101 and second TFT substrate 201) are located on the inside.

Second TFT substrate 201 is a substrate in which the TFT layer is formed on the transparent substrate such as the glass substrate. The TFT layer is a driving circuit layer, and a TFT, a wiring for driving the TFT, and the like are formed in the TFT layer. A pixel electrode used to apply voltage to first liquid crystal layer 103 is formed on a planarization layer of the TFT layer.

Second counter substrate 202 is a substrate on which the pixel formation layer is formed on the transparent substrate such as the glass substrate. The pixel formation layer of second counter substrate 202 includes a lattice-shaped or stripe-shaped black matrix constituting pixels. In the present exemplary embodiment, since second display panel 200 displays the monochrome image, the color filter is not formed in the pixel formation layer.

Second liquid crystal layer 203 is sealed in a gap between second TFT substrate 201 and second counter substrate 202. The liquid crystal material of second liquid crystal layer 203 can be appropriately selected according to the driving system.

A pair of first polarizing plates 104 is bonded to both surfaces of first display panel 100, respectively. The pair of first polarizing plates 104 is disposed such that polarization directions of first polarizing plates 104 are orthogonal to each other. That is, the pair of first polarizing plates 104 is disposed in a cross-nicol state.

A pair of second polarizing plates 204 is bonded to both surfaces of second display panel 200, respectively. The pair of second polarizing plates 204 is disposed such that the polarization directions of second polarizing plates 204 are orthogonal to each other. That is, the pair of second polarizing plates 204 is disposed in the cross-nicol state.

The pair of first polarizing plates 104 and the pair of second polarizing plates 204 are a sheet-shaped polarizing film made of, for example, a resin material. A phase-difference plate film (phase-difference film) may be bonded to first polarizing plate 104 and second polarizing plate 204.

First display panel 100 and second display panel 200 are bonded together by adhesive layer 105. Specifically, first polarizing plate 104 on a back side of first display panel 100 and second polarizing plate 204 on the front side of second display panel 200 adhere each other by adhesive layer 105. For example, a transparent bonding agent such as an optically clear adhesive (OCA) can be used as the adhesive layer 105. A diffusion sheet may separately be inserted between first display panel 100 and second display panel 200.

Backlight 300 includes a plurality of LEDs 310, transparent substrate 320, optical sheet 330, and reflecting plate 340.

Each of the plurality of LEDs 310 is an example of the light emitting element. For example, a white LED light source emitting white light can be used as LED 310.

In the present exemplary embodiment, backlight 300 is a direct-under type backlight, and the plurality of LEDs 310 are two-dimensionally arranged. Specifically, the plurality of LEDs 310 are arranged into a matrix shape at a bottom of lower frame 630. In the present exemplary embodiment, the plurality of LEDs 310 are disposed on reflecting plate 340 disposed in a recess of lower frame 630.

Transparent substrate 320 and optical sheet 330 are disposed in front of LED 310 (light emitting side). That is, transparent substrate 320 and optical sheet 330 are opposite to main body 632 of lower frame 630. Specifically, transparent substrate 320 and optical sheet 330 are disposed so as to be opposite to bottom plate 632a of main body 632.

Transparent substrate 320 is a transparent rigid plate. For example, transparent substrate 320 is a glass plate transparent to visible light. In this case, tempered glass having excellent mechanical strength is preferably used as transparent substrate 320. Thus, transparent substrate 320 having small thermal expansion or contraction and high rigidity can be constructed using the glass plate as the transparent substrate 320.

Optical sheet 330 provides optical action to the light emitted from LED 310. For example, a diffusion plate (diffusion sheet) and/or a prism sheet that diffuses the light emitted from LED 310 can be used as optical sheet 330. For example, optical sheet 330 is a resin sheet made of a resin material. The number of optical sheets 330 may be one or plural.

Transparent substrate 320 is disposed on the side of lower frame 630, and optical sheet 330 is disposed on the side of second display panel 200. Optical sheet 330 is disposed on transparent substrate 320. Specifically, optical sheet 330 is supported by transparent substrate 320 placed on a surface on the side of second display panel 200 of transparent substrate 320.

Consequently, optical sheet 330 is opposite to second display panel 200, and is disposed on transparent substrate 320 with a predetermined interval from second display panel 200. In other words, optical sheet 330 and second display panel 200 are disposed with a space interposed therebetween in a Z-axis direction, and an air layer exists between optical sheet 330 and second display panel 200.

Although optical sheet 330 placed on transparent substrate 320 is in contact with transparent substrate 320, optical sheet 330 and transparent substrate 320 do not adhere, but optical sheet 330 is not fixed to transparent substrate 320.

An outer peripheral end of optical sheet 330 is covered with panel support 621 of middle frame 620. Specifically, the outer peripheral end of optical sheet 330 is opposite to panel support 621 of middle frame 620, and optical sheet 330 is disposed with a predetermined interval from panel support 621. That is, optical sheet 330 and panel support 621 of middle frame 620 are disposed with the space interposed therebetween in the Z-axis direction, and the air layer exists between the outer peripheral end of optical sheet 330 and panel support 621 of middle frame 620.

Transparent substrate 320 is disposed such that the outer peripheral end of transparent substrate 320 is located between substrate support 631 of lower frame 630 and panel support 621 of middle frame 620. In the present exemplary embodiment, the outer peripheral end of transparent substrate 320 is supported by substrate support 631 of lower frame 630. Specifically, the outer peripheral end of transparent substrate 320 is placed on a flange of reflecting plate 340 placed on substrate support 631.

As illustrated in FIG. 6, optical sheet 330 has an elongated shape in planar view. Specifically, optical sheet 330 includes sheet main body 331 that is of a rectangular main region in planar view, and protrusion (ear) 332 protruding outward from each of central portions of both ends in a longitudinal direction of seat main body 331. Specifically, protrusion 332 is formed so as to overhang into a rectangular shape from a central portion of a short side of seat main body 331.

Optical sheet 330 is fixed to lower frame 630. In the present exemplary embodiment, a part of the outer peripheral end of optical sheet 330 is fixed to substrate support 631 of lower frame 630. Specifically, in optical sheet 330, only the central portions of both the ends in the longitudinal direction of optical sheet 330 are fixed to substrate support 631 of lower frame 630.

In the present exemplary embodiment, as illustrated in FIGS. 6 and 9, protrusion 332 of optical sheet 330 protrudes from transparent substrate 320, and optical sheet 330 is fixed to substrate support 631 of lower frame 630 in protrusion 332. Specifically, through-hole 332a is provided in protrusion 332 of optical sheet 330, and movement of optical sheet 330 is restricted in an XY plane by inserting through-hole 332a of protrusion 332 in projection 631a provided on substrate support 631 of lower frame 630. Consequently, optical sheet 330 is fixed to lower frame 630.

As illustrated in FIGS. 7 to 9, cushion member 810 is disposed between panel support 621 of middle frame 620 and a peripheral region of a portion of optical sheet 330. The peripheral region is fixed to lower frame 630. Specifically, cushion member 810 is disposed in a gap between panel support 621 of middle frame 620 and protrusion 332 of optical sheet 330. For example, cushion member 810 is fixed to panel support 621. For example, foamed rubber can be used, but not limited to, as the cushion member 810.

In this way, a displacement of optical sheet 330 can be prevented in a thickness direction (Z-axis direction) by inserting cushion member 810 between panel support 621 and optical sheet 330. That is, the movement of the optical sheet 330 is restricted in the Z-axis direction by cushion member 810.

In the present exemplary embodiment, between panel support 621 and optical sheet 330, cushion member 810 is disposed only at a position corresponding to protrusion 332, but cushion member 810 is not disposed in a portion other than the position corresponding to protrusion 332. That is, in the portion other than the position corresponding to protrusion 332 between panel support 621 of middle frame 620 and optical sheet 330, a bottom surface of panel support 621 and a top surface of optical sheet 330 are directly opposite to each other only with the air layer interposed therebetween.

In this way, optical sheet 330 is pressed only at the position corresponding to protrusion 332 by inserting cushion member 810 in the position corresponding to protrusion 332. That is, in the portion (that is, seat main body 331) other than the position corresponding to the protrusion 332, optical sheet 330 is not pressed by the cushion member or the like, but is in a free state. Thus, most of the outer peripheral end of optical sheet 330 is a free end.

Reflecting plate 340 has a function of reflecting the light of the plurality of LEDs 310. Reflecting plate 340 is disposed at the bottom of main body 632 of lower frame 630. Reflecting plate 340 is made of a thin metal plate such as a steel plate and an aluminum plate. In this case, the surface of the reflecting plate 340 may be subjected to white painting. Reflecting plate 340 may be made of a white resin material.

As described above, frame 600 includes upper frame 610, middle frame 620, and lower frame 630. For example, upper frame 610, middle frame 620, and lower frame 630 are fixed to one another by screws.

Upper frame 610 that can be of the first frame is a front frame disposed on an upper side (a positive side in the Z-axis direction) in frame 600. In the present exemplary embodiment, upper frame 610 is a metal frame having a rectangular frame shape in planar view and an L-shape in section, and is made of a metal material, such as a steel plate and an aluminum plate, which has high rigidity. By way of example, upper frame 610 can be formed by performing press working such as bending on a metal plate cut into a predetermined shape.

In the present exemplary embodiment, upper frame 610 includes frame portion 611 and a first sidewall 612.

Frame portion 611 is a bezel portion that covers a peripheral portion of the display surface of first display panel 100. Specifically, frame portion 611 is formed into a frame shape so as to cover a whole periphery at the outer peripheral end of display surface of first display panel 100. In the present exemplary embodiment, frame portion 611 protrudes into a flange shape from the upper end of first sidewall 612.

Cushion member 820 is provided on the inner surface (bottom surface) at a leading end of frame portion 611. Cushion member 820 is disposed between frame portion 611 and first display panel 100. Specifically, cushion member 820 is inserted so as to be sandwiched between frame portion 611 and first polarizing plate 104. Consequently, while the end of first display panel 100 is protected, the gap between upper frame 610 and first display panel (first polarizing plate 104) is eliminated to prevent minute objects such as dust and insects from invading in display device 1. For example, foamed rubber can be used, but it is not limited to as cushion member 820.

First sidewall 612 is a plate-shaped sidewall plate extending from frame portion 611 toward the side of lower frame 630 in the Z-axis direction. That is, first sidewall 612 is formed so as to extend downward from frame portion 611.

In the present exemplary embodiment, first sidewall 612 is located beside first display panel 100, second display panel 200, and backlight 300. Specifically, first sidewall 612 faces second sidewall 622 of middle frame 620.

Middle frame 620 that can be of the second frame is disposed between upper frame 610 and lower frame 630. Middle frame 620 supports first display panel 100 and second display panel 200 from the side of backlight 300. In the present exemplary embodiment, middle frame 620 is a metal frame having a rectangular frame shape in planar view and an L-shape in section, and is made of a metal material, such as a steel plate and an aluminum plate, which has high rigidity. By way of example, middle frame 620 can be formed by performing press working such as bending on a metal plate cut into a predetermined shape.

In the present exemplary embodiment, middle frame 620 includes panel support 621 and second sidewall 622.

Panel support 621 is a middle flange supporting first display panel 100 and second display panel 200. Panel support 621 sandwiches first display panel 100 and second display panel 200 with frame portion 611 of upper frame 610. That is, the outer peripheral ends of first display panel 100 and second display panel 200 are located between panel support 621 and frame portion 611. Panel support 621 is formed into a frame shape so as to cover the whole periphery at the outer peripheral end of a back surface of second display panel 200.

In the present exemplary embodiment, cushion member 830 is provided on the inner surface (top surface) of a leading end of panel support 621. Cushion member 830 is disposed between panel support 621 and second display panel 200. Specifically, cushion member 830 is inserted so as to be sandwiched between panel support 621 and second polarizing plate 204. Consequently, while the end of second display panel 200 is protected, the gap between middle frame 620 and second display panel (second polarizing plate 204) is eliminated to prevent minute objects such as dust and insects from invading in display device 1. For example, foamed rubber can be used, but it is not limited to as cushion member 830.

Second sidewall 622 is a plate-shaped sidewall plate extending from panel support 621 toward the side of lower frame 630 in the Z-axis direction. That is, second sidewall 622 is formed so as to extend downward from panel support 621. Specifically, second sidewall 622 passes through a gap between first sidewall 612 of upper frame 610 and substrate support 631 of lower frame 630, and extends from panel support 621 toward the side of lower frame 630 in the Z-axis direction.

In the present exemplary embodiment, second sidewall 622 is located beside backlight 300. Specifically, second sidewall 622 is disposed between first sidewall 612 of upper frame 610 and side plate 632b of main body 632 of lower frame 630. Second sidewall 622 faces first sidewall 612 of upper frame 610, and faces side plate 632b of main body 632 of lower frame 630.

Second sidewall 622 includes bent portion 622a bent along principal surface 631x at the end of substrate support 631 of lower frame 630 and side surface 631y orthogonal to principal surface 631x. That is, bent portion 622a of second sidewall 622 is formed in a stepwise manner at the end of substrate support 631.

Lower frame 630 that can be of the third frame is a rear frame disposed on the back side (a negative side in the Z-axis direction) in frame 600. Lower frame 630 accommodates LED 310 constituting backlight 300 therein, and holds transparent substrate 320 and reflecting plate 340, which constitute backlight 300. In the present exemplary embodiment, lower frame 630 is a metal casing formed into a recessed shape as a whole, and is made of a metal material, such as a steel plate and an aluminum plate, which has high rigidity.

In the present exemplary embodiment, lower frame 630 includes substrate support 631 and main body 632.

Substrate support 631 is a lower flange extending from main body 632 to support transparent substrate 320. Substrate support 631 extends into a plate shape toward first sidewall 612. Specifically, substrate support 631 is a horizontal plate in which the Z-axis direction is set to a normal direction.

Main body 632 constitutes an accommodating space in which the plurality of LEDs 310 are accommodated. Main body 632 includes bottom plate (back plate) 632a having a rectangular shape in planar view and frame-shaped side plate 632b protruding upward from outer peripheral end of bottom plate 632a.

Substrate support 631 is provided on a peripheral edge of main body 632. Specifically, flange-shaped substrate support 631 is formed outward from upper end of side plate 632b of main body 632. As illustrated in FIGS. 7 to 9, the end of substrate support 631 includes principal surface 631x and side surface 631y orthogonal to principal surface 631x. In the examples of FIGS. 7 to 9, principal surface 631x is a plane in which the Z-axis direction is set to the normal direction, and side surface 631y is a plane in which a direction orthogonal to the Z-axis direction is set to the normal direction.

The plurality of LEDs 310 are disposed on the bottom plate 632a. In the present exemplary embodiment, the plurality of LEDs 310 are arranged on reflecting plate 340 disposed on bottom plate 632a with a heat conducting sheet interposed therebetween. Side plate 632b extends in the Z-axis direction between the outer peripheral end of bottom plate 632a and substrate support 631 of lower frame 630.

Figure 10:
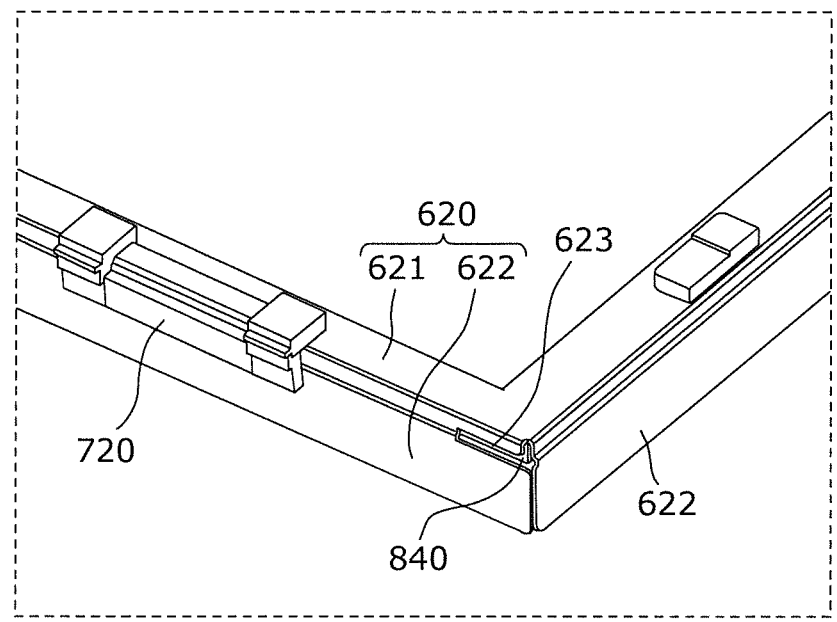
FIG. 10 is an enlarged perspective view illustrating surroundings of the corner of the display device according to the exemplary embodiment.
Figure 11:
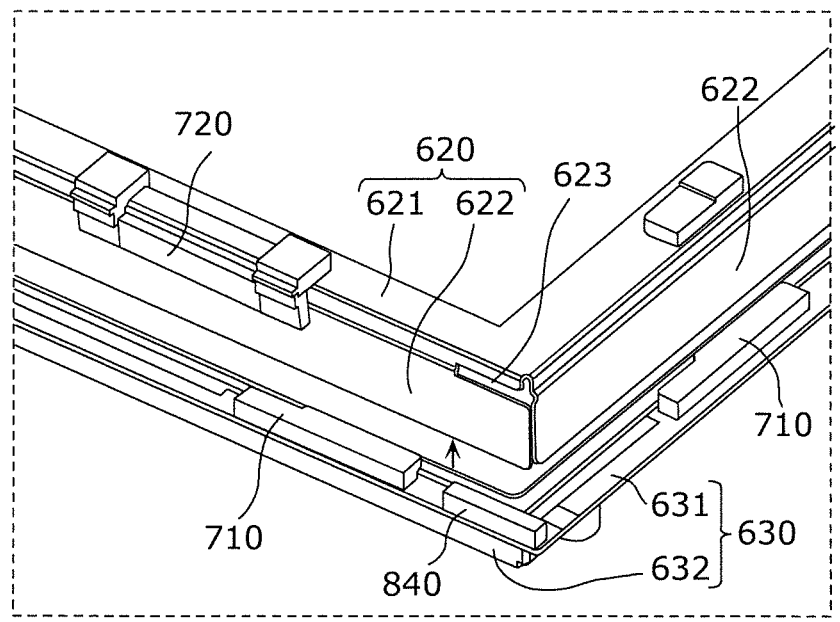
FIG. 11 is an exploded perspective view illustrating the surroundings of the corner of the display device according to the exemplary embodiment.

As illustrated in FIGS. 10 and 11, a gap exists at a corner of middle frame 620 covering lower frame 630. FIG. 10 is an enlarged perspective view illustrating surroundings of the corner of display device 1 according to the present exemplary embodiment, and FIG. 11 is an exploded perspective view illustrating the surroundings of the corner of display device 1.

When gap 623 is provided at the corner of middle frame 620, middle frame 620 having a predetermined shape can easily be formed by bending. However, minute foreign matters such as dust and insects are likely to invade in display device 1 from gap 623.

Consequently, in the present exemplary embodiment, cushion member 840 (corner cushion) closing gap 623 at the corner of middle frame 620 is provided between middle frame 620 and lower frame 630 as illustrated in FIGS. 10 and 11. Specifically, cushion member 840 is disposed between panel support 621 of middle frame 620 and substrate support 631 of lower frame 630.

Thus, it is possible to reduce that minute objects such as dust and insects invade in display device 1 from gap 623, by disposing cushion member 840 closing gap 623 of middle frame 620 between middle frame 620 and lower frame 630. For example, foamed rubber can be used, but it is not limited to as cushion member 840.

First spacer member 710 is not disposed at corners of middle frame 620 and lower frame 630, while the plurality of first spacer members 710 are also disposed between middle frame 620 and lower frame 630. That is, cushion member 840 at the corner and first spacer member 710 are disposed while displaced from each other.

As illustrated in FIG. 8, the plurality of first spacer members 710 are a lower spacer maintaining a constant interval between middle frame 620 and lower frame 630 in the Z-axis direction.

In the present exemplary embodiment, each of the plurality of first spacer members 710 is disposed between panel support 621 of middle frame 620 and substrate support 631 of lower frame 630. Specifically, each of the plurality of first spacer members 710 is sandwiched between panel support 621 and substrate support 631, and restricts the gap between panel support 621 and substrate support 631.

Transparent substrate 320 is held by the plurality of first spacer members 710, and each of the plurality of first spacer members 710 restricts the movement of transparent substrate 320. In the present exemplary embodiment, each of the plurality of first spacer members 710 has recess 711 in which the outer peripheral end of transparent substrate 320 is accommodated. The movement of transparent substrate 320 is restricted by accommodating the outer peripheral end of transparent substrate 320 in recess 711.

Specifically, recess 711 acts as the restriction unit that restricts the movement of transparent substrate 320 in the Z-axis direction. In the present exemplary embodiment, recess 711 also restricts the movement of transparent substrate 320 in the direction (horizontal direction) orthogonal to the Z-axis direction. That is, recess 711 restricts not only the movement of transparent substrate 320 in the Z-axis direction but also the movement of transparent substrate 320 in the X-axis direction or the Y-axis direction.

In this case, first spacer member 710 disposed on a long side of display device 1 restricts the movement of transparent substrate 320 in the Z-axis direction and the Y-axis direction, and the first spacer member 710 disposed on a short side of display device 1 restricts the movement of transparent substrate 320 in the Z-axis direction and the X-axis direction.

Figure 12:
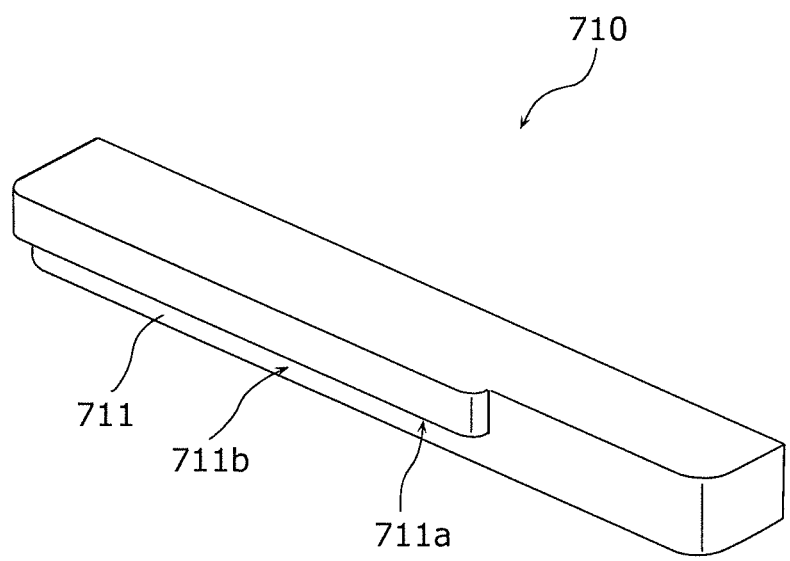
FIG. 12 is a perspective view illustrating the first spacer of the display device according to the exemplary embodiment.

As illustrated in FIGS. 8 and 12, recess 711 of each first spacer member 710 includes first inner surface 711a and second inner surface 711b. First inner surface 711a faces principal surface 320x of transparent substrate 320. Specifically, first inner surface 711a is a plane in which the Z-axis direction is set to the normal direction, and is a surface parallel to principal surface 320x of transparent substrate 320. Second inner surface 711b is orthogonal to first inner surface 711a, and faces side surface 320y of transparent substrate 320. Specifically, second inner surface 711b is a plane in which the direction orthogonal to the Z-axis direction is set to the normal direction, and is a surface parallel to side surface (edge surface) 320y at the outer peripheral end of transparent substrate 320.

First inner surface 711a and second inner surface 711b of recess 711 may be in contact with the surface of transparent substrate 320, but there may be a slight gap of a degree of a dimensional tolerance between first inner surface 711a and the surface of transparent substrate 320, and between second inner surface 711b and the surface of transparent substrate 320.

Thus, transparent substrate 320 is disposed at a fixed position so as not to move in the Z-axis direction, the X-axis direction, and the Y-axis direction by accommodating the outer peripheral end of transparent substrate 320 in recess 711 of each of the plurality of first spacer members 710 disposed around the whole periphery of display device 1. That is, the movement of transparent substrate 320 in three directions orthogonal to each other is restricted by accommodating the outer peripheral end of transparent substrate 320 in recess 711.

Second spacer member 720 in FIGS. 5, 10, and 11 is an upper spacer disposed between middle frame 620 and upper frame 610, and maintains a constant interval between middle frame 620 and upper frame 610 in the Z-axis direction.

In the present exemplary embodiment, each of the plurality of second spacer members 720 is disposed between panel support 621 of middle frame 620 and frame portion 611 of upper frame 610. Specifically, each of the plurality of second spacer members 720 is sandwiched between panel support 621 and frame portion 611, and restricts the gap between panel support 621 and frame portion 611.

Each of the plurality of second spacer members 720 restricts the movement of first display panel 100 and second display panel 200. Specifically, each second spacer member 720 restricts the movement of first display panel 100 and second display panel 200 in the horizontal direction.

Effects of display device 1 according to the present exemplary embodiment will be described below while the circumstances leading to the technique of the present disclosure are included.

As described above, in recent years, a direct-under type LED backlight is used as the backlight of the liquid crystal display device.

Similarly to backlight 300 of display device 1 of the exemplary embodiment, the direct-under type LED backlight of the conventional liquid crystal display device includes the plurality of LEDs arranged at the bottom of the lower frame, the transparent substrate disposed in front of the plurality of LEDs, and the optical sheet.

In the conventional direct-under type LED backlight, the whole periphery at the outer peripheral end of the optical sheet and the transparent substrate are pressed by the cushion member, and the outer peripheral end of the transparent substrate is placed on the substrate support (lower flange) of the lower frame.

Figure 13:
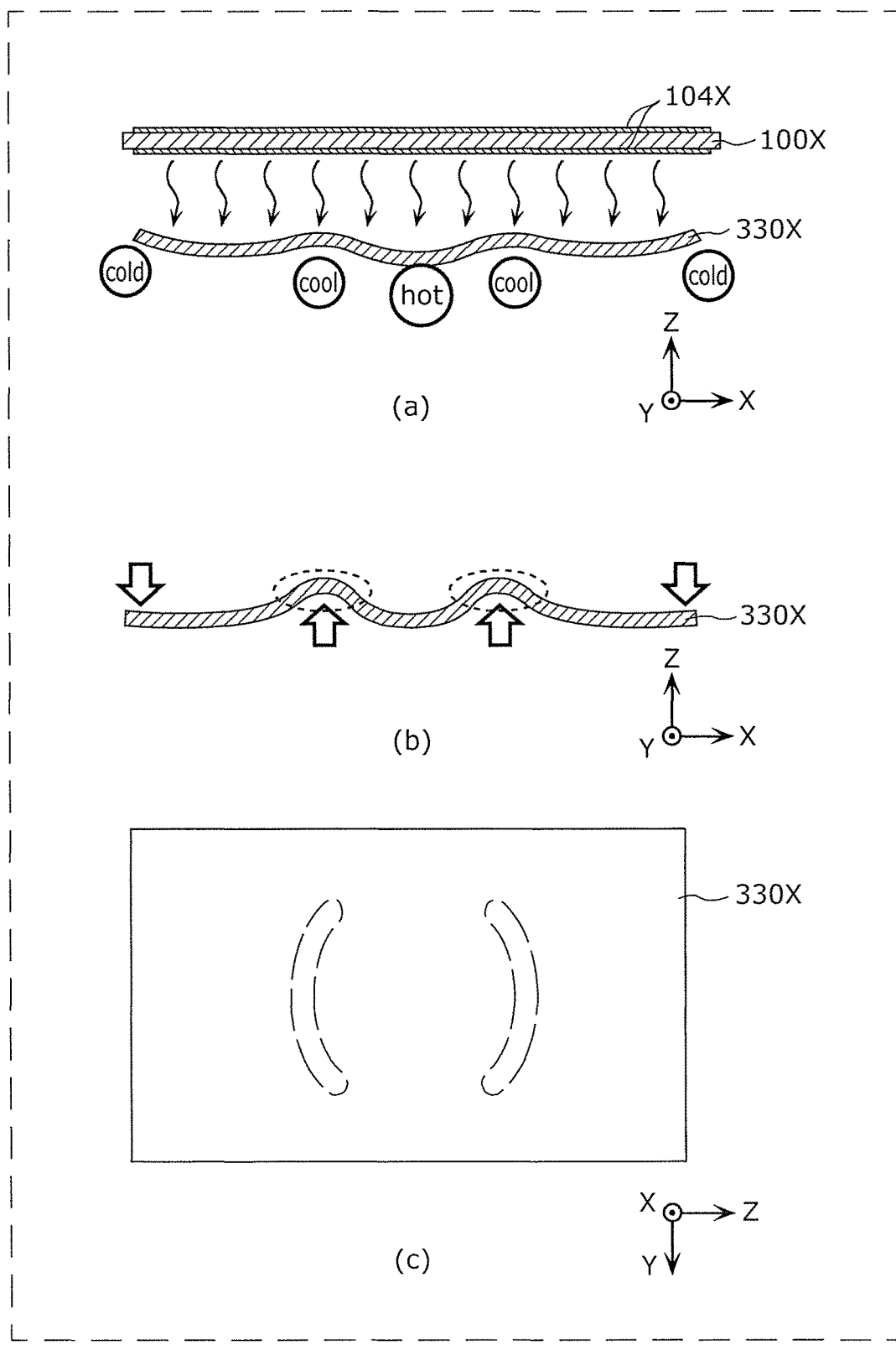
FIG. 13 is a view illustrating a reason of an undulation generated in an optical sheet.

Thus, in the liquid crystal display device in which the direct-under type LED backlight is used, among the light emitted from the LED, the component blocked by polarizing plate 104X bonded to display panel 100X thermally affects optical sheet 330X as thermal radiation as illustrated in FIG. 13A. Consequently, a temperature difference is generated in optical sheet 330 due to a distribution of light striking on polarizing plate 104X.

Additionally, in order to cool the backlight, the liquid crystal display device is provided with a built-in cooling fan or a heat radiation structure such as a radiation fin. Such a cooling mechanism is provided around the lower frame or on the back side of the lower frame. Since the lower frame is cooled by a cooling mechanism, the outer peripheral end of the transparent substrate is cooled by the lower frame when the transparent substrate is supported by the substrate support of the lower frame. As a result, optical sheet 330X is thermally affected by the transparent substrate, and the temperature difference (temperature distribution) is generated between the central portion and the peripheral portion of the transparent substrate.

Thus, optical sheet 330X receives a thermal influence of the thermal radiation of polarizing plate 104X and a thermal influence of the transparent substrate, which causes the temperature difference in optical sheet 330X. Consequently, the undulation is generated in optical sheet 330X. In particular, in the conventional liquid crystal display device, since the whole periphery at the outer peripheral end of the optical sheet is pressed by the cushion member, the temperature difference generated in optical sheet 330X appears as a difference in thermal contraction of optical sheet 330X, and the undulation is generated in optical sheet 330X as illustrated in FIGS. 13A to 13C. For example, optical sheet 330X is partially bent so as to undulate. As a result, quality of the image displayed on the liquid crystal display device is degraded.

In particular, in the liquid crystal display device in which the two liquid crystal display panels are superimposed as the display panel, a light amount of the backlight is set larger in order to compensate for a decrease in light transmittance by each liquid crystal display panel. In this case, the temperature difference in optical sheet 330X due to the thermal radiation of the polarizing plate is increased, and the temperature difference between the central portion and the peripheral portion of the transparent substrate is increased. Consequently, the undulation of the optical sheet is also increased, and the quality of the image is significantly degraded.

As a result of intensive investigation on the problem by the present inventors, the idea of the present disclosure was obtained by the knowledge that the undulation of the optical sheet can be prevented by devising the structure around the outer peripheral end of each of the optical sheet and the transparent substrate.

Specifically, in display device 1 of the present exemplary embodiment, the plurality of first spacer members 710 that restrict the movement of transparent substrate 320 in the Z-axis direction are disposed between panel support 621 of middle frame 620 and substrate support 631 of lower frame 630, and optical sheet 330 and panel support 621 are disposed with a space interposed therebetween in the Z-axis direction.

Thus, the outer peripheral end constituting the free end can be provided in optical sheet 330 by interposing the space between optical sheet 330 and panel support 621. First spacer member 710 restricts the movement of transparent substrate 320 in the Z-axis direction, which allows the constant distance between the optical sheet 330 and the panel support 621 to be maintained in the Z-axis direction. That is, optical sheet 330 can maintain the outer peripheral end constituting the free end.

Thus, even if optical sheet 330 receives the thermal influence of the thermal radiation of the polarizing plate and the thermal influence of the transparent substrate 320 to generate the stress of the thermal contraction difference in optical sheet 330 due to the temperature difference generated in optical sheet 330, the stress can be absorbed by the free end of the outer peripheral end of optical sheet 330. This allows relaxation of the undulation of optical sheet 330. Consequently, the degradation of the image quality of display device 1 due to the undulation of optical sheet 330 can be prevented.

Additionally, in display device 1 according to the present exemplary embodiment, each first spacer member 710 restricts not only the movement of transparent substrate 320 in the Z-axis direction, but also the movement of transparent substrate 320 in the direction orthogonal to the Z-axis direction.

With this configuration, the movement of transparent substrate 320 in all directions can be restricted by the plurality of first spacer members 710. Consequently, the plurality of first spacer members 710 can hold transparent substrate 320 while maintaining the constant distance in the Z-axis direction in the space between optical sheet 330 and panel support 621.

In display device 1 according to the present exemplary embodiment, each first spacer member 710 includes recess 711 in which the outer peripheral end of transparent substrate 320 is accommodated as the restriction unit that restricts the movement of transparent substrate 320. Recess 711 includes first inner surface 711*a* facing principal surface 320*x* of transparent substrate 320 and second inner surface 711*b*, which is orthogonal to first inner surface 711*a* and faces side surface 320*y* of transparent substrate 320.

With this configuration, the movement of transparent substrate 320 can easily and surely be restricted by the plurality of first spacer members 710.

In the display device 1 according to the present exemplary embodiment, a part of the outer peripheral end of optical sheet 330 is fixed to lower frame 630 and cushion member 810 is disposed between panel support 621 of middle frame 620 and the peripheral region of the portion fixed to lower frame 630 of optical sheet 330.

With this configuration, optical sheet 330 can be fixed to lower frame 630 at a place where cushion member 810 is disposed. Consequently, optical sheet 330 including the outer peripheral end constituting the free end and the fixing portion constituting the fixed end can be constructed.

Additionally, in the present exemplary embodiment, optical sheet 330 has the long shape in planar view, and only the central portions at both the ends in the longitudinal direction of optical sheet 330 are fixed to lower frame 630.

With this configuration, the undulation of optical sheet 330 can effectively be relaxed, so that the degradation of the image quality of display device 1 can further be prevented. For example, as compared with the case that the whole ends in the longitudinal direction of optical sheet 330 is fixed to lower frame 630, the undulation of optical sheet 330 can effectively be relaxed. The undulation of optical sheet 330 can effectively be relaxed compared with the case that only the central portions of both ends in a lateral direction of optical sheet 330 or the whole both ends in the lateral direction are fixed to lower frame 630

In the present exemplary embodiment, optical sheet 330 includes protrusions 332 protruding outward from the central portions at the both ends in the longitudinal direction of optical sheet 330 in a planar view, and optical sheet 330 is fixed to lower frame 630 at protrusion 332.

With this configuration, since the protrusion 332 constitutes the fixed end of optical sheet 330, the undulation of optical sheet 330 can effectively be relaxed compared with the case that the central portion of the short side of the rectangular optical sheet is fixed to lower frame 630.

(Modification)

The display device of the present disclosure has been described above based on the exemplary embodiment, but the present disclosure is not limited to the exemplary embodiment.

For example, in the exemplary embodiment, bent portion 622*a* is provided on second sidewall 622 of middle frame 620 as illustrated in FIG. 7, but the present disclosure is not limited to the exemplary embodiment. Specifically, like display device 1A according to a modification in FIG. 14, the second sidewall 622A of middle frame 620A may be a flat plate in which the bent portion (step) is not provided.

However, like display device 1 of the exemplary embodiment, when bent portion 622*a* bent along principal surface 631*x* at the end of substrate support 631 of lower frame 630 and side surface 631*y* orthogonal to principal surface 631*x* is provided in second sidewall 622 of middle frame 620, it is better from the viewpoint of contamination of the foreign matter.

Thus, by providing bent portion 622*a* in second sidewall 622 of middle frame 620, minute objects such as dust and insects can be prevented from invading in display device 1 from the gap formed between the side surface at the outer peripheral end of substrate support 631 and the side surface of second sidewall 622.

Figure 14:
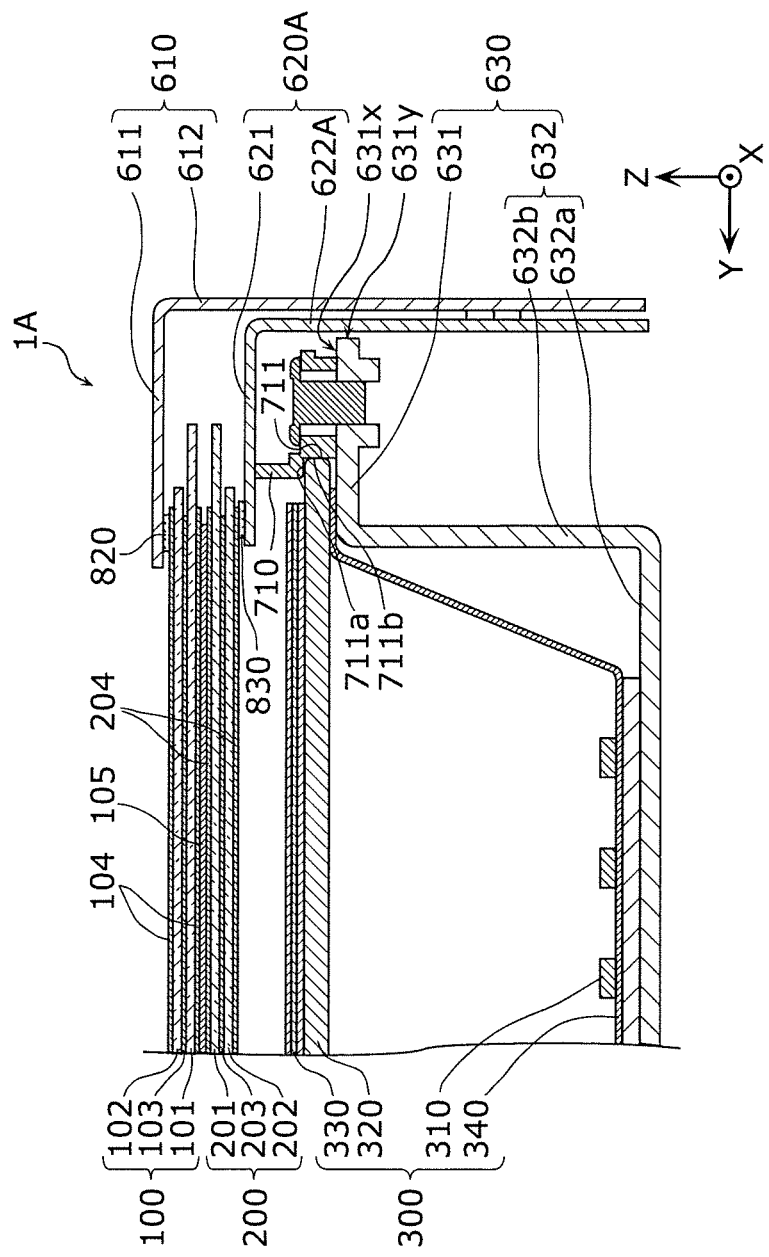
FIG. 14 is a cross-sectional view of a display device according to a variation.

That is, as illustrated in FIG. 14, in second sidewall 622A in which bent portion 622*a* is not provided, the slight gap is generated between the side surface at the outer peripheral end of substrate support 631 and the side surface of second sidewall 622 depending on an installation posture of display device 1. In this case, the minute object invades in display device 1 when passing through the gap.

On the other hand, as illustrated in FIG. 7, in second sidewall 622 in which bent portion 622*a* is provided, principal surface (top surface) 631*x* at the outer peripheral end of substrate support 631 and the bottom surface of bent portion 622*a* are closed even if the slight gap is generated between the side surface at the outer peripheral end of substrate support 631 and the side surface of second sidewall 622 depending on the installation posture of display device 1. Consequently, even if the minute object passes through the slight gap between side surface 631*y* at the outer peripheral end of substrate support 631 and the side surface of second sidewall 622, the minute object cannot invade further. Consequently, the minute object can be prevented from invading in display device 1.

As described above, in display device 1 of FIG. 7, since bent portion 622*a* is provided in second sidewall 622, at least one of the gap between side surface 631*y* at the outer peripheral end of substrate support 631 and the side surface of second sidewall 622 and the gap between principal surface (top surface) 631*x* at the outer peripheral end of substrate support 631 and the bottom surface of bent portion 622*a* is closed regardless of the installation posture of display device 1. Consequently, the minute object can be prevented from invading in display device 1.

In the above exemplary embodiment, display device 1 includes first display panel 100 and second display panel 200 superimposed on first display panel 100 as the display panel, but the present disclosure is not limited to the exemplary embodiment. That is, the number of display panels in display device 1 is not limited, but may be one or at least two.

In the above exemplary embodiment, first display panel 100 displays the color image and second display panel 200 displays the monochrome image. However, the present disclosure is not limited to the exemplary embodiment. For example, first display panel 100 may display the monochrome image and second display panel 200 may display the color image.

In the above embodiment, white light is produced using phosphor as a wavelength converter in the backlight 300, but this example is not limiting; for example, quantum dots may be used as a wavelength converter. In these cases, white LED elements employing quantum dots may be used as the light source for the backlight 300, but an optical film (quantum dot film) containing quantum dots such as a quantum dot enhancement film (QDEF) may be used as the optical sheet 330, and blue LED elements that emit blue light that excites the quantum dots may be used as the light source for the backlight 300. Note that two types of quantum dots may be used to convert the blue light into green light and red light. By using quantum dots as the wavelength converter, compared to when phosphor is used as the wavelength converter, it is possible to achieve a liquid crystal display device having more desirable color rendering properties.

Those skilled in the art will readily appreciate that many modifications are possible in the above exemplary embodiment and variations without materially departing from the novel teachings and advantages of the present disclosure. Accordingly, all such modifications are intended to be included within the scope of the present disclosure.

What is claimed is:

1. A display device comprising:
   a display panel;
   a first frame including a frame portion covering a peripheral portion of a display surface of the display panel;
   a second frame including a panel support sandwiching the display panel with the frame portion;
   an optical sheet that is opposite to the display panel in a first direction, an outer peripheral end of the optical sheet being opposite to the panel support;
   a transparent substrate on which the optical sheet is disposed;
   a third frame including a main body having an accommodation space in which a plurality of light emitting elements are accommodated, and a substrate support extending from the main body to support the transparent substrate; and
   a spacer member disposed between the panel support and the substrate support, the spacer member consisting of parts different from the second frame and the third frame, wherein
   the first frame, the second frame, the third frame, and the spacer member respectively are separate components,
   the spacer member includes a recess that restricts movement of the transparent substrate in the first direction and in a second direction orthogonal to the first direction,
   the recess includes a first inner surface facing a principal surface of the transparent substrate from a side of the panel support and a second inner surface that is orthogonal to the first inner surface and faces a side surface of the transparent substrate,
   the spacer member is bent so as to define the first inner surface and the second inner surface,
   the outer peripheral end of the transparent substrate is sandwiched between the first inner surface of the recess and the substrate support of the third frame in the first direction, and
   the transparent substrate is held by the spacer member and the substrate support of the third frame.

2. The display device according to claim 1, wherein
   a part of the outer peripheral end of the optical sheet is fixed to the third frame, and
   a cushion member is disposed between the panel support of the second frame and a peripheral region of a part of the optical sheet which is fixed to the third frame.

3. The display device according to claim 2, wherein
   the optical sheet has an elongated shape in planar view, and
   central portions of both ends in a longitudinal direction of the optical sheet are fixed to the third frame.

4. The display device according to claim 3, wherein
   the optical sheet includes protrusions protruding outward from the central portions of both the ends in the longitudinal direction in planar view, and
   the optical sheet is fixed to the third frame at the protrusion.

5. The display device according to claim 1, wherein
   the first frame includes a plate-shaped first sidewall extending from the frame portion toward a side of the third frame in the first direction,
   the substrate support of the third frame extends into a plate shape toward the first sidewall,
   the second frame passes through a gap between the first sidewall and the substrate support and has a plate-shaped second sidewall extending from the panel support toward the side of the third frame in the first direction, and
   the second sidewall includes a bent portion bent along a principal surface at an end of the substrate support and a side surface orthogonal to the principal surface.

6. The display device according to claim 1, wherein
   a gap exists at a corner of the second frame, and
   a cushion member closing the gap is disposed between the second frame and the third frame.

7. The display device according to claim 1, wherein the transparent substrate is a glass plate.

8. The display device according to claim 1, wherein the display panel includes a first display panel that is of a liquid crystal display panel and a second display panel that is of a liquid crystal display panel superimposed on the first display panel.

9. The display device according to claim 2, further comprising:
   a plurality of the spacer member,
   wherein the cushion member is disposed between neighboring two spacer members among the plurality of the spacer member in planar view.

10. The display device according to claim 1, wherein the optical sheet and the panel support are disposed with a space interposed therebetween in the first direction.

11. The display device according to claim 1, wherein the side surface of the transparent substrate that is faced by the second inner surface is an outer side surface of the transparent substrate.

12. The display device according to claim 4, wherein
   the protrusions are located outside the edge of the transparent substrate,
   a through-hole is provided in the protrusion of the optical sheet,
   a projection is provided on the substrate support of the third frame, the projection is extending in the first direction, and
   the optical sheet is fixed to the third frame by inserting the through-hole of the protrusion in the projection of the third frame.

* * * * *